(12) United States Patent
Sosogi

(10) Patent No.: US 8,674,501 B2
(45) Date of Patent: Mar. 18, 2014

(54) SEMICONDUCTOR INTEGRATED CIRCUIT DEVICE

(75) Inventor: Yasuhide Sosogi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 410 days.

(21) Appl. No.: 12/659,462

(22) Filed: Mar. 9, 2010

(65) Prior Publication Data

US 2010/0164099 A1 Jul. 1, 2010

Related U.S. Application Data

(63) Continuation of application No. PCT/JP2007/069705, filed on Oct. 9, 2007.

(51) Int. Cl.
*H01L 23/498* (2006.01)

(52) U.S. Cl.
USPC ............ 257/737; 257/E23.021; 257/E23.079; 257/E23.151; 257/E23.153

(58) Field of Classification Search
USPC ........... 257/737, E23.068, E23.153, E23.079, 257/E23.021, E23.151; 716/110, 118, 122, 716/138
See application file for complete search history.

(56) References Cited

U.S. PATENT DOCUMENTS

| | | | |
|---|---|---|---|
| 6,516,446 B2 * | 2/2003 | Anzai | 716/112 |
| 7,424,696 B2 * | 9/2008 | Vogel et al. | 716/133 |
| 8,000,157 B2 | 8/2011 | Ijitsu | |
| 2002/0074656 A1 | 6/2002 | Ujiie et al. | |
| 2003/0168748 A1 | 9/2003 | Katagiri et al. | |
| 2006/0267706 A1 | 11/2006 | Takase | |

FOREIGN PATENT DOCUMENTS

| | | |
|---|---|---|
| JP | 7-22510 | 1/1995 |
| JP | 07022510 A * | 1/1995 |
| JP | 9-64191 | 3/1997 |
| JP | 11-250700 | 9/1999 |
| JP | 2002-170826 | 6/2002 |
| JP | 2003-264256 | 9/2003 |
| WO | 2007/099579 | 9/2007 |

OTHER PUBLICATIONS

European Search Report dated Oct. 8, 2010 and issued in corresponding European Patent Application 07829443.6.
International Search Report for PCT/JP2007/069705, mailed on Nov. 20, 2007.
Japanese Office Action issued Jul. 31, 2012 in corresponding Japanese Patent Application No. 2009-536881.
Japanese Office Action issued Oct. 16, 2012 in corresponding Japanese Patent Application No. 2009-536881.

* cited by examiner

*Primary Examiner* — Ermias Woldegeorgis
(74) *Attorney, Agent, or Firm* — Staas & Halsey LLP

(57) ABSTRACT

A semiconductor integrated circuit device includes plural circuit units each having plural logic circuits; and plural power terminals supplying power source from outside to the semiconductor integrated circuit device, in which the plural circuit units each having plural logic circuits have common packaging design with each other, and lengths in a vertical direction and a lateral direction of the circuit units each having plural logic circuits are equal to an even multiple of a distance between the power terminals adjacent to each other.

2 Claims, 9 Drawing Sheets

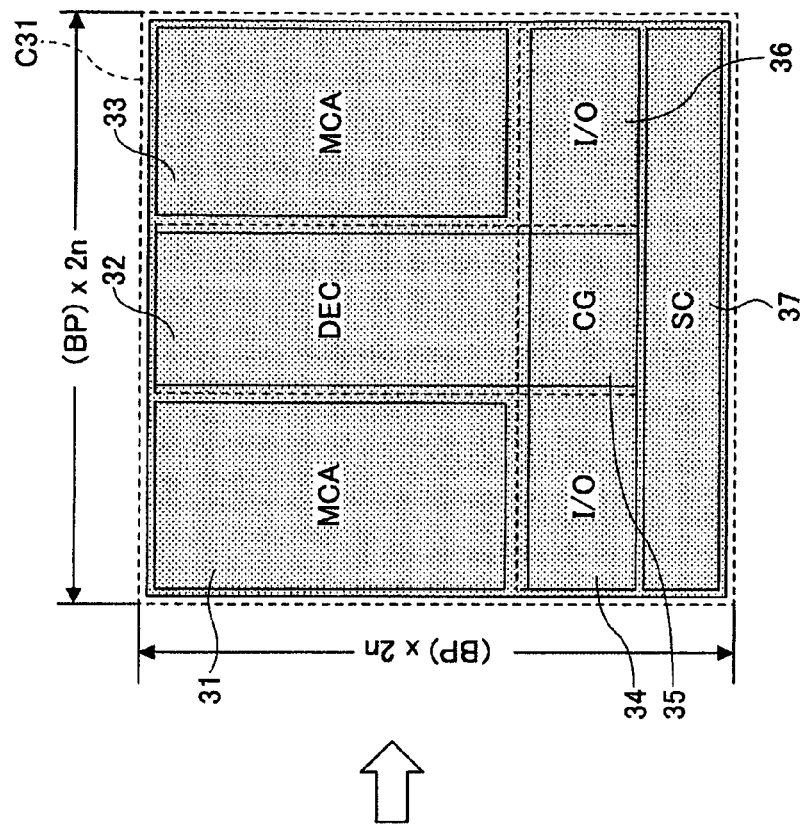
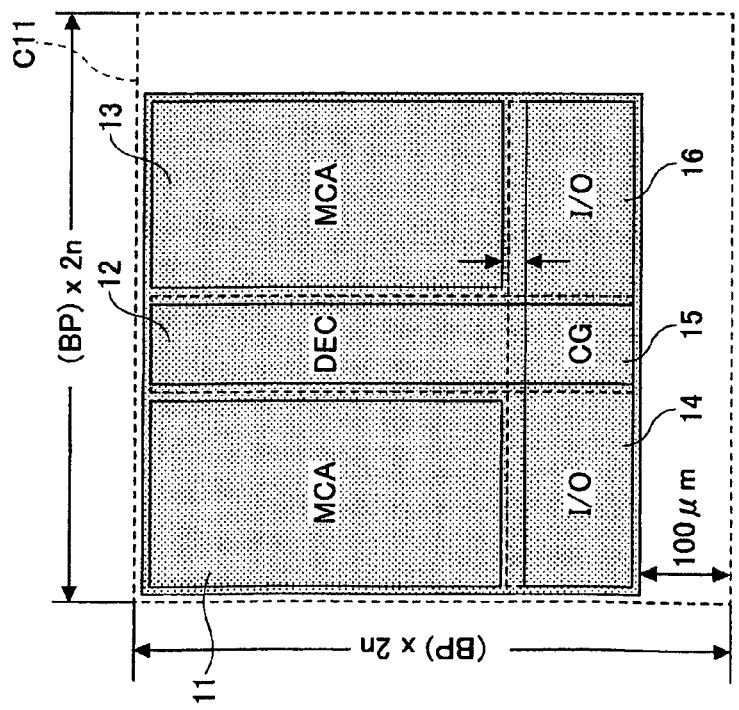

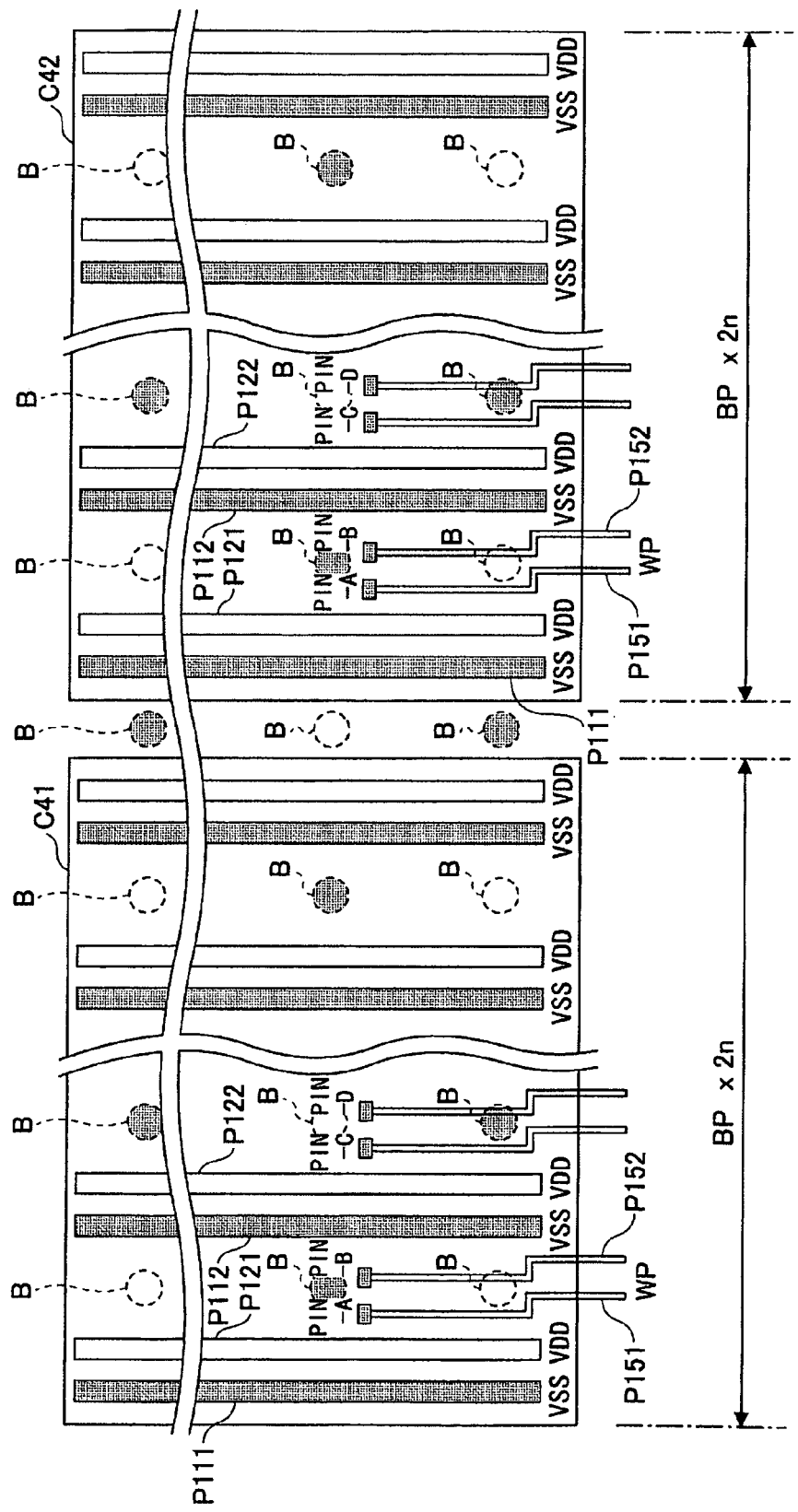

SEMICONDUCTOR INTEGRATED CIRCUIT DEVICE

CROSS-REFERENCE TO RELATED APPLICATIONS

This application is a U.S. continuation application filed under 35 USC 111(a) claiming benefit under 35 USC 120 and 365(c) of PCT application JP2007/069705, filed Oct. 9, 2007. The foregoing application is hereby incorporated herein by reference.

FIELD

The embodiment discussed herein is related to a semiconductor integrated circuit device.

BACKGROUND

Japanese Laid-Open Patent Application No. 7-22510 discloses a semiconductor integrated circuit device capable of facilitating the layout and disposing power source wiring and electrodes by repeatedly disposing power supply block cells. Specifically, a CCB bump (a power source electrode) is disposed at the center of power supply block cells, and CCB bumps for signals are disposed at the four corners. That is, both the CCB bump and the CCB bumps for signals are orderly disposed on the principal surface of semiconductor chips in such a manner that the consistency is maintained with the layout of the basic cells. When preparing the basic cell, a basic circuit region having a plurality of MIS.FETs required for forming one basic circuit is prepared, and a plurality of regions are laid out in mirror symmetry with a predetermined power supply wiring disposed above the basic cell as a border. By doing this, the disposing and laying out of semiconductor elements forming the basic cell can be performed more easily, man-hours for laying and disposing can be reduced thereby shortening the laying and disposing time.

Further, Japanese Laid-Open Patent Applications No. 11-250700 discloses a memory mixed semiconductor integrated circuit device in which a test circuit for operating the efficient test of a large-scaled memory macro by a few terminals for test is incorporated. Specifically, a memory macro is mixed with a logic part, and provided with a test circuit for decoding a coded input signal for test supplied to an input terminal for test for testing the memory macro, and test-operating the memory macro without the logic part. The test circuit is provided with a signal generating circuit for decoding a coded memory control signal among input signals, and selectively performing direct access to the memory macro according to the memory control signal and non-coded address signal and data signal for executing the test operation, and a control circuit for decoding a coded memory macro activation signal and a memory macro selection signal among input signals for test, and selectively activating the signal generating circuit.

SUMMARY

According to an aspect of the present invention, a semiconductor integrated circuit device is capable of improving the efficiency of packaging design without affecting the packaging efficiency.

Further, according to an aspect of the present invention, a semiconductor integrated circuit device includes plural units (i.e., circuit units such as cache memories) each having plural logic circuits, and plural power terminals supplying a power source from outside to the semiconductor integrated circuit device, in which the plural units each having plural logic circuits have common packaging design with each other, and lengths in a vertical direction and a lateral direction of the units each having plural logic circuits are equal to an even multiple of a distance between the power terminals adjacent to each other.

The object and advantages of the invention will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIG. 7 illustrates another schematic comparison of a configuration of a conventional semiconductor integrated circuit device (FIG. 7A) and an exemplary configuration of a semiconductor integrated circuit device according to an embodiment of the present invention (FIG. 7B);

FIG. 9 is another top view illustrating an exemplary configuration of a semiconductor integrated circuit device according to an embodiment of the present invention.

DESCRIPTION OF EMBODIMENT

Conventionally, in a typical flow of a packaging design operation of a semiconductor integrated circuit, due to limited development resources, to effectively perform the packaging design operation of the semiconductor integrated circuit device as much as possible, a fundamental logic circuit block is designed first and so-called a flip development is performed on the logic circuit block. In the figures, symbols are used to denote FIG. 1 is a top view illustrating an example of semiconductor integrated circuit.

In the figures, the following symbols are used and are defined as follows: FD: flip development, BLK: block, CM: cache memory, SC: standard cell, BP: bump pitch, VSS-B: VSS bump, VDD-B: VDD bump, PIN-A: pin A, PIN-B: pin B, PIN-C: pin C, Pin-D: pin D, WP: wiring pattern, MCA: memory cell array, CG: clock generator, and DEC: decoder etc.

Figure 1:
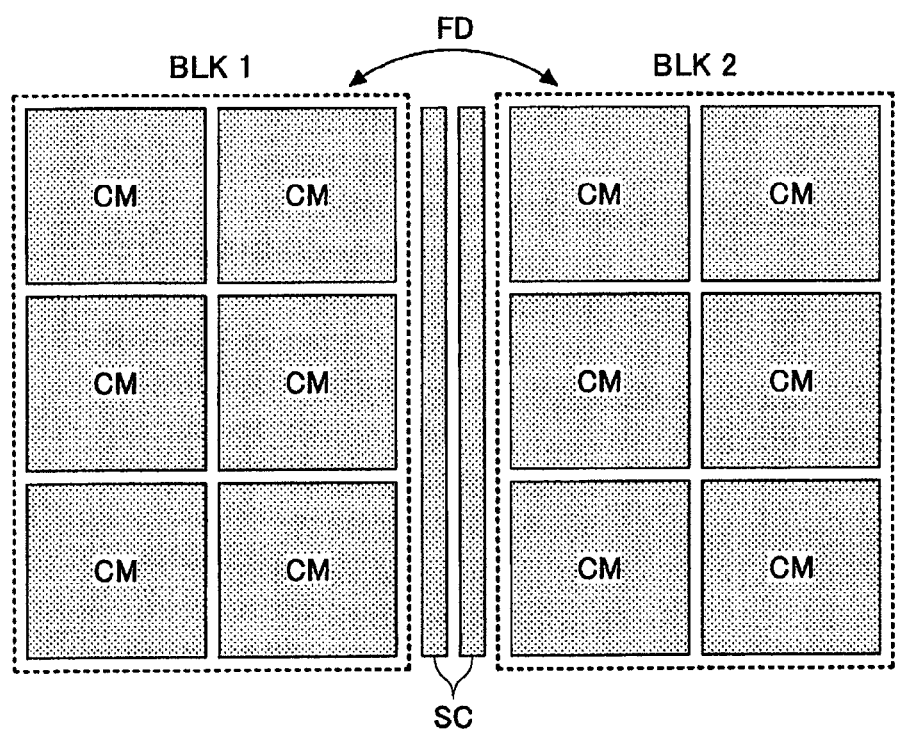
FIG. 1 is a top view illustrating an example of packaging design of a semiconductor integrated circuit device.

As illustrated in FIG. 1, the semiconductor integrated circuit device includes blocks 1 and 2 as logic circuit blocks, and each block includes six cache memories. Further, in this case of FIG. 1, it is assumed that those six cache memories have similar packaging design with each other, thereby facilitating the packaging design.

Herein, the flip development refers to as an operation of copying packaging design so that laterally symmetric packaging design can be formed as exemplarily illustrated in FIG. 1. In the case of FIG. 1, the packaging design of the block 1 having six cache memories is copied to form the packaging design of the block 2 so that the packaging design of the blocks 1 and 2 are bilaterally symmetric with each other. By repeating the flip development, the whole floor plan is provided.

Figure 2:
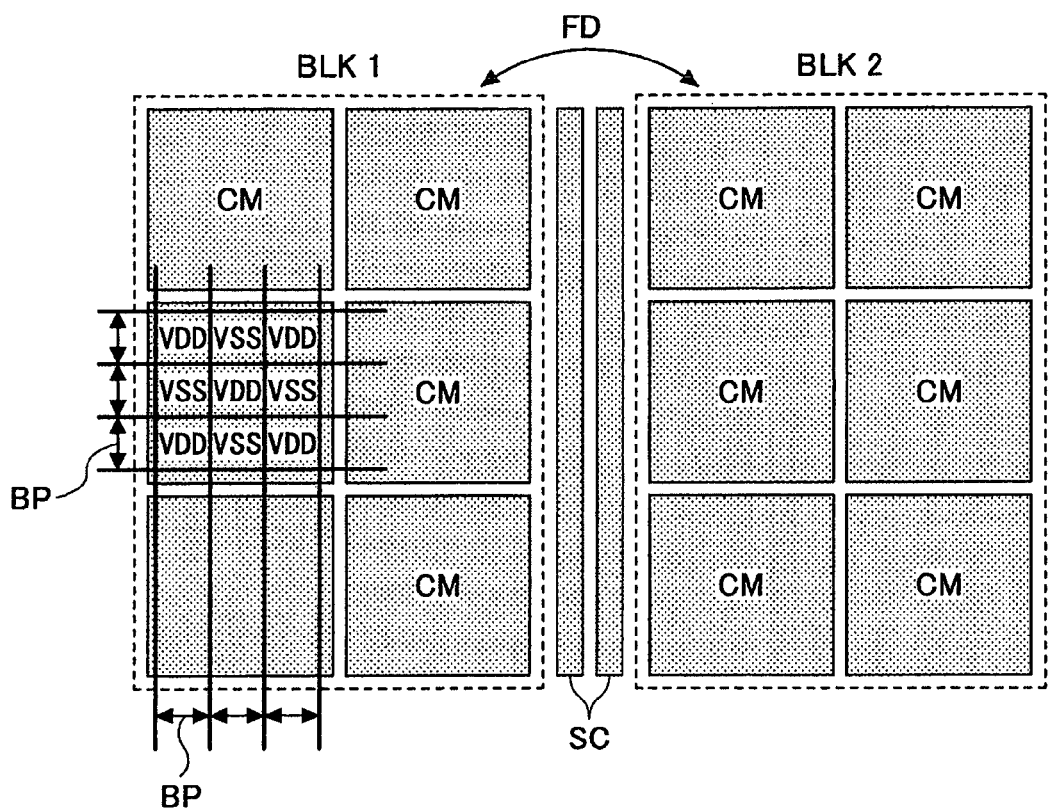
FIG. 2 is a drawing illustrating a problem which may occur in a conventional semiconductor integrated circuit device.

FIG. 2 illustrates an exemplary relationship between bumps formed in an upper layer of the semiconductor integrated circuit device having the configuration of FIG. 1 and the cache memories included in the semiconductor integrated circuit device. Further, FIG. 3 obliquely illustrates an example of an arrangement of the bumps and a structure of power source patterns in such a semiconductor integrated circuit device.

Figure 3:
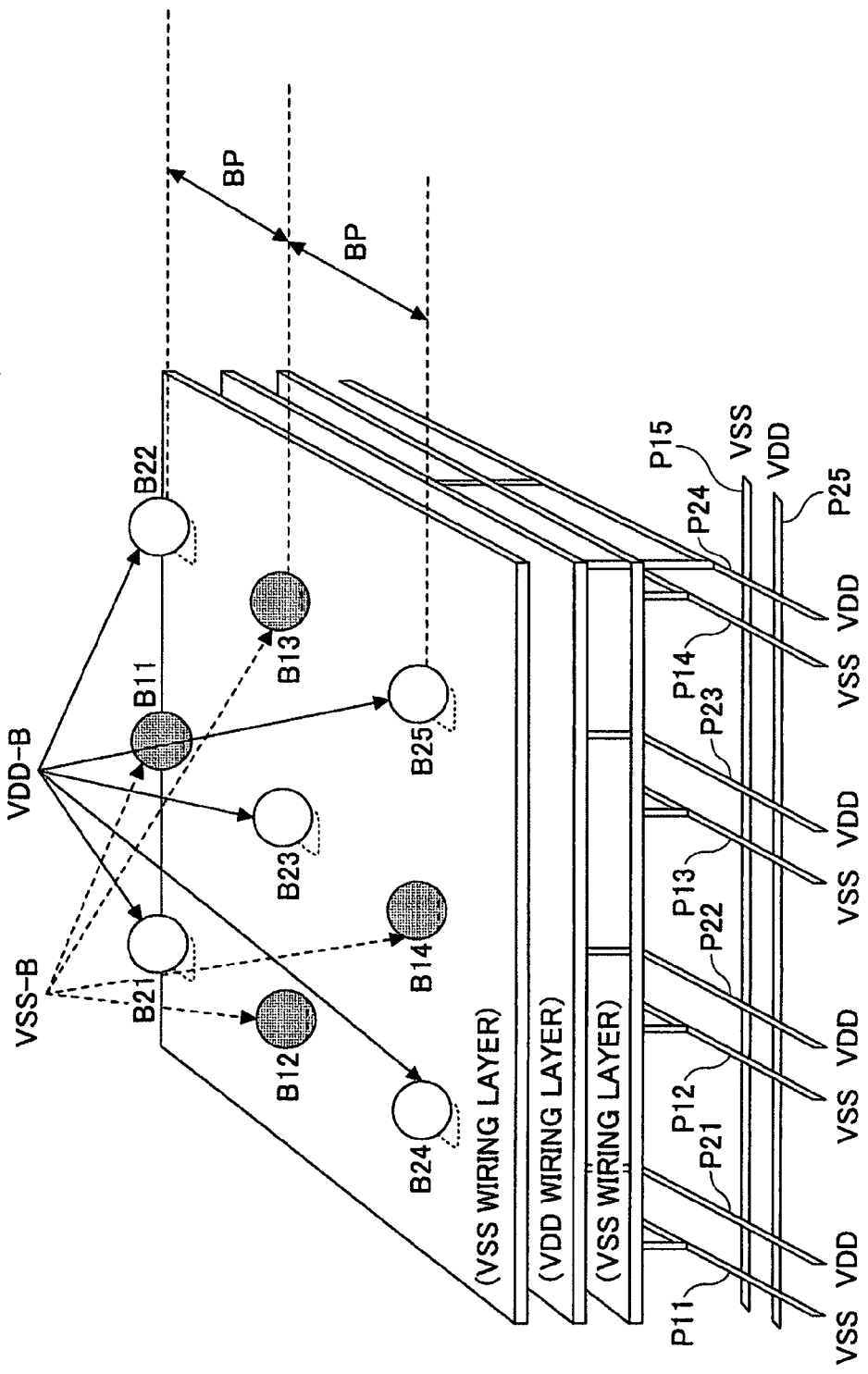
FIG. 3 is an oblique perspective view illustrating an example of packaging design of a semiconductor integrated circuit device.

This configuration illustrated in FIG. 3 corresponds to, for example, one of the six cache memories in FIG. 2.

The bump refers to an electrode to supply power source to the semiconductor integrated circuit device from an external power source and may also be called a power source terminal.

In FIG. 2, a relationship is described between one of the six cache memories in the block 1 and the positions of the bumps formed on an upper layer. In FIG. 2, symbols VSS and VDD denote the positions of VSS bumps and VDD bumps, respectively. The VSS bump and the VDD bump refer to a power source (i.e., positive) terminal and a ground (i.e., negative) terminal, respectively. Further, as illustrated in FIG. 2, a distance corresponding to a position interval of the VSS bump and the VDD bump adjacent to each other refers to a bump pitch.

Further, as illustrated in FIGS. 2 and 3, the VDD bumps and the VCC bumps, which are different in type from each other, are alternately arranged one after another so that the same type of the bumps (e.g., the VDD bumps or the VCC bumps) are not adjacent to each other. This is because the positive terminal and the negative terminal are required to be formed in a mutually corresponding manner to supply a power source.

FIG. 3 illustrates the positions of the VSS bumps B11 through B14 and the VDD bumps B21 through B25 formed on an upper layer of the block and the positions of VSS power source patterns P11 through P15 and VDD power source patterns P21 through P25 formed on a lower layer.

In the corresponding figures, the VSS bumps and the VDD bumps are depicted as circles on the uppermost layer of the block; and the VSS power source patterns and the VDD power source patterns are depicted as elongated belt-like patterns extending in the vertical and lateral directions in the lowermost layer of the block.

The VSS bumps and the VDD bumps are electrically connected to the VSS power source patterns and the VDD power source patterns, respectively, through vias or the like. By having this configuration, an external power source is supplied to the VSS power source patterns and the VDD power source patterns through the VSS bumps and the VDD bumps, the VSS power source patterns and the VDD power source patterns being formed on the lowermost layer of the block and the VSS bumps and the VDD bumps being formed on the upper most layer of the block.

As schematically illustrated in FIG. 3, plural VSS power source patterns and plural VDD power source patterns of the semiconductor integrated circuit device are formed (disposed) at regular intervals corresponding to the VSS bumps and the VDD bumps on the uppermost layer.

On the other hand, in a design process of the cache memories and the like to be formed on a layer lower than that on which the VSS power source patterns and the VDD power source patterns are formed, it is generally intended to reduce the size of each cache memory as much as possible to reduce the chip area of the semiconductor integrated circuit device.

This design method may be effective in the viewpoint of reducing the area of each cache memory.

However, when this design method is simply employed, as exemplarily illustrated in FIG. 2, the size of each cache memory may not match with the bump pitch of the VSS bumps and the VDD bumps on the uppermost layer.

More specifically, as exemplarily illustrated in the middle left-hand cache memory of block 1 in FIG. 2, the lengths in the vertical and lateral directions of the cache memory are longer than three times the bump pitch and shorter than four times the bump pitch. Furthermore, as illustrated in FIG. 2, four VSS bumps (corresponding to the rectangles in which "VSS" is indicated) and five VDD bumps (corresponding to the rectangles in which "VDD" is indicated) belong to the cache memory.

Figure 4:
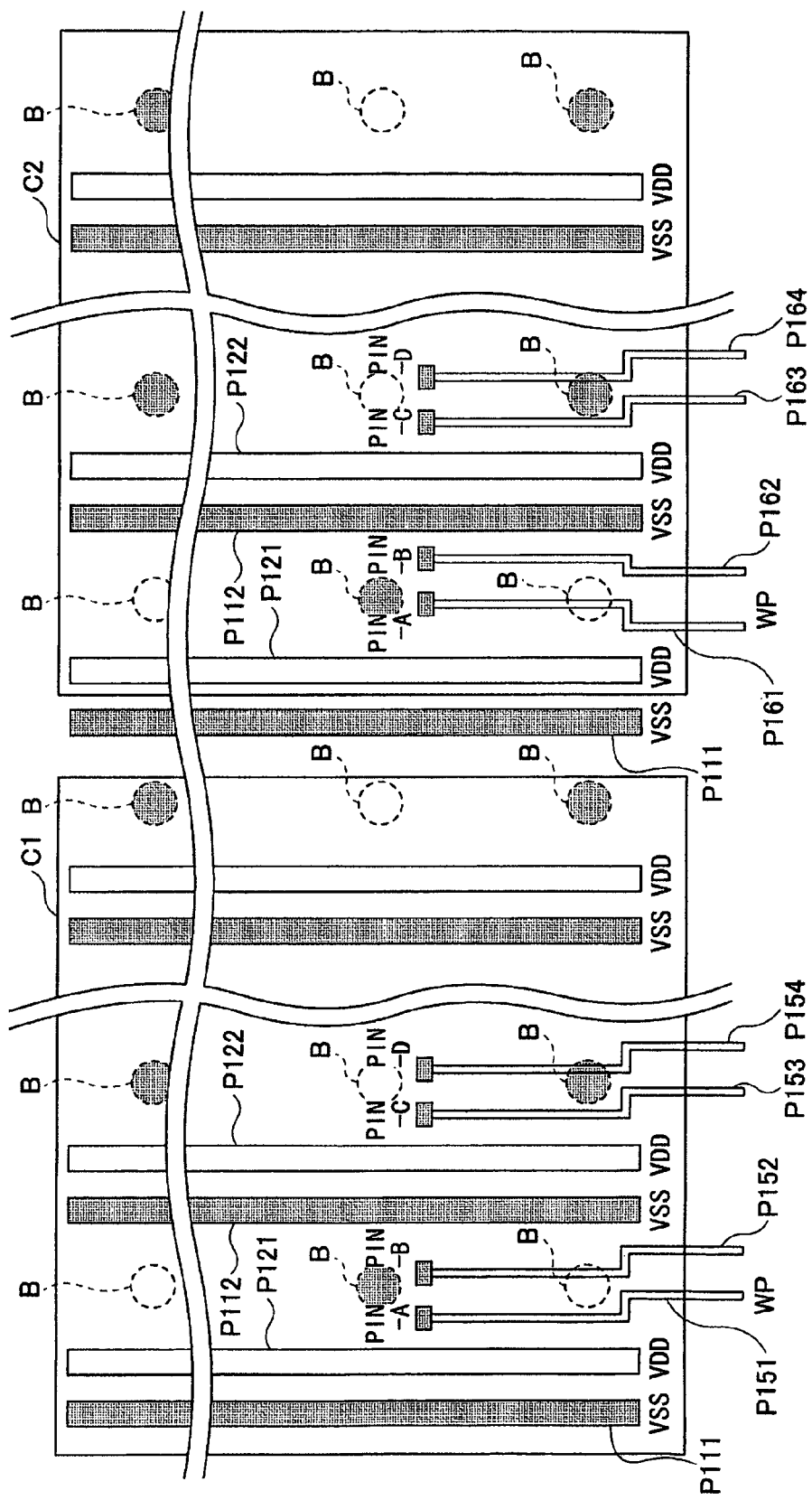
FIG. 4 is another drawing illustrating a problem which may occur in a conventional semiconductor integrated circuit device.

FIG. 4 is a top view illustrating the cache memories C1 and C2 included in the semiconductor integrated circuit device. Further, in the configuration of FIG. 4, the power source patterns are disposed at regular intervals.

Next, the relationships between the power source patterns in cache memories C1 and C2 and the power source patterns illustrated in FIG. 3 are described.

In FIG. 3, for the purposes of facilitating the understanding of the relationship between the bumps on the upper layer and the power source patterns, a case is described where two power source patterns are provided for each of the bumps. More specifically, in the case of FIG. 3, the VSS bump B14 corresponds to two VSS power source patterns P11 and P12; and VDD bump B24 corresponds to two VDD power source patterns P21 and P22.

On the other hand, generally, more than two power source patterns are corresponded to a single bump. Similar to the case of FIG. 3, in the example illustrated in FIG. 4, two power source patterns are corresponded (connected) to a single bump B. Further, in the example of FIG. 4, each of the VSS power source patterns and the VDD power source patterns is depicted as an elongated belt-like pattern extending in the upper and lower (vertical) direction in the figure. Further, in FIG. 4, which is similar to FIG. 3, the half-toned bumps B represent the VSS bump and the bumps B without half-toned pattern represent the VDD bumps.

Further, in FIG. 4, pins A, B, C, and D represent input/output terminals of the logic circuit block formed on a layer lower than that on which the power source patterns are formed. To electrically connect the pins A, B, C, and D to the outside of the semiconductor integrated circuit device, as described in FIG. 4, wiring patterns P151, P152, P153, and P154 extending in the vertical direction in FIG. 4 are provided so as to be connected to the pins A, B, C, and D, respectively.

In this case, when a terminal inside the cache memory is required to be connected to the outside of the cache memory using a wiring, the wiring may be required to be formed so as not to be in contact with any of the VSS power source patterns P111 and P112 and the VDD power source patterns P121 and P122 and the like.

Further, in a case where the flip development is performed on the block of the logic circuit to effectively perform the packaging design operation, it may be required to consider that any of the VSS power source patterns and the VDD power source patterns on the upper layer does not short-circuit with any of the wirings connecting between the terminals inside the cache memories and the outside of the cache memories. To that end, it may be desirable that the wirings are disposed in a manner such that the relative positions of the wirings with respect to the VSS power source patterns and the VDD power source patterns on the upper layer are constant (common) in each cache memory, the wirings connecting between the terminals inside the cache memories and the outside of the cache memories.

However, for example, in the case where the lengths in the vertical and lateral directions of the cache memory are longer than three times the bump pitch and shorter than four times the bump pitch as illustrated in FIG. 2, relative positions of the VSS bumps and the VDD bumps on the upper layer with respect to the respective cache memories on the lower layer may vary depending on the cache memories. In this case, as illustrated in FIG. 4, the relative positions of the VSS power source patterns and the VDD power source patterns on the upper layer with respect to the cache memory C1 may differ from that with respect to the cache memory C2.

More specifically, in the example of FIG. 4, in the cache memory C1, there are VSS power source pattern P111 and VDD power source pattern P121 on the left-hand side of the pins A and B. On the other hand, in the cache memory C2, the VSS power source pattern P111, the VDD power source pattern P121, and the pins A and B are also provided similar to the cache memory C1. However, the VSS power source pattern P111 and the VDD power source pattern P121 in the cache memory C2 are more shifted to the left-hand side from the pins A and B when compared with the case of cache memory C1.

Further, as described above, the plural VSS power source patterns and the plural VDD power source patterns are formed at regular intervals. Because of this feature, in the cache memory C2, the VSS power source pattern P111 and the VDD power source pattern P121 on the right-hand side of the pins A and B are also more shifted to the left-hand side than in the case of the cache memory C1. In this state, if the same wiring pattern as that formed in the cache memory C1 is formed (disposed) in the cache memory C2 and vice verse, a problem may occur.

More specifically, as illustrated in FIG. 4, in the cache memory C1, the wiring patterns P151 and P152 are bent in L shape near the bottom end of the cache memory C1, so that the patterns are shifted to the right-hand side. However, if the wiring patterns P151 and P152 bent to the right-hand side in the cache memory C1 are applied to the wiring patterns P161 and P162 in the same manner in the cache memory C2, as may be apparent from FIG. 4, the wiring pattern P162 from pin B may be in contact with (i.e., may short-circuit with) the adjacent VSS power source pattern P112. Therefore, in this state, to avoid the contact, as illustrated in FIG. 4 and unlike the case of the cache memory C1, the wiring patterns P161 and P162 are bent in L shape near the bottom end of the cache memory C2, so that the patterns are shifted to the left-hand side. Therefore, in such a case described above, it may become necessary to perform different packaging design with respect to each cache memory, which may degrade the efficiency of the total packaging design operation.

Next, embodiments of the present invention is described with reference to the accompanying drawings.

In the above description, a case is described with reference to FIG. 2 where the lengths in the vertical and lateral directions of the cache memory are longer than three times the bump pitch and shorter than four times the bump pitch, which may cause a problem of degradation of the efficiency of the total packaging design.

On the other hand, according to an embodiment of the present invention, a packaging design of the cache memories is performed in a manner such that the lengths in the vertical and lateral directions of the cache memory are equal to an even multiple of (e.g., four times) the bump pitch.

By performing the packaging design operation in this way, the relative positions of the VSS bumps and the VDD bumps on the upper layer with respect to the cache memories may not differ from each other and may become similar to each other. Therefore, the problem described above may be resolved. More specifically, by performing the packaging design operation in this way, it may become unnecessary to perform packaging design operation on each cache memory; that is, the packaging design data of one cache memory may also be applied to the other cache memories without changing the packaging design data (i.e., without necessity of performing additional packaging design operation to modify the packaging design data for other cache memories).

However, if the lengths in the vertical and lateral directions of the cache memory are equal to an odd multiple of the bump pitch, the following problem may occur.

As described above, in the semiconductor integrated circuit device, there are required two types of bumps, which are the bump for the power source side (i.e., the VDD bump) and the bump for the ground side (I.e., the VSS bump). This may be obvious because both positive and negative electrodes (terminals) are required to supply power source to the semiconductor integrated circuit device.

Next, a case is described in more detail where the lengths in the vertical and lateral directions of the cache memory are equal to an odd multiple of (in this case, as an example, three times) the bump pitch. In this case, as described above, four VSS bumps and five VDD bumps may belong to some of the cache memories. As a result, the number of the VSS bumps is not equal to the number of the VDD bumps. However, as described above, the VDD bump and the VCC bump are to be used as a pair; therefore, it may be required that the number of the VSS bumps is to be equal to the number of the VDD bumps in each of the cache memories.

On the other hand, according to an embodiment of the present invention, as described above, the lengths in the vertical and lateral directions of the cache memory are equal to an even multiple of the bump pitch. For example, by performing the packaging design operation in a manner such that the lengths in the vertical and lateral directions of the cache memory are equal to four times the bump pitch, the number of VSS bumps may be equal to the number of the VDD bumps in each of the cache memories.

Further, in this case where the lengths in the vertical and lateral directions of the cache memory are equal to an even multiple of the bump pitch, it is not always necessary that the same even number of times such as four times are applied to both the vertical direction and the lateral directions of the cache memory. In other words, different even number of times, for example, four times and six times, may be separately applied to the vertical direction and the lateral directions, respectively, of the cache memories. This is because, even in such a case, the number of VSS bumps may be equal to the number of the VDD bumps in each of the cache memories.

In the following, an embodiment of the present inventions is further described with reference to the accompanying drawings. Further, the embodiment of the present invention is described by illustrating the cache memory as an example.

According to an embodiment of the present invention, in a packaging design operation of a semiconductor integrated circuit device, by enlarging an area of the cache memory, the lengths in the vertical and lateral directions of the cache memory may be adjusted to be equal to an even multiple (i.e., 2n, herein a symbol "n" denotes an integer greater than zero) of the bump pitch. Further, a typical logic circuit such as a logic circuit having a repeated pattern, a test circuit and the like may be included (integrated) in the cache memories.

According to this embodiment of the present invention, by integrating a typical logic circuit such as a logic circuit having a repeated pattern, a test circuit and the like in the cache memories of the semiconductor integrated circuit, the lengths in the vertical and lateral directions of the cache memory may be adjusted to be equal to 2n of the bump pitch. As a result, it may become possible to remove a wasteful dead space which may be created in a block of a basic circuit generated in a high-level design operation.

As a result, after the flip development is performed on the block of the basic circuit in the high-level design operation, it may become unnecessary to separately design the relative positions of the wirings with respect to the power source patterns on the upper layer, the wirings being connecting between the terminals inside the cache memories and the outside of the cache memories; and further, it may become possible to repeatedly use packaging design data of one cache memory to be applied to the other cache memories, which may remarkably improve the efficiency of the packaging design operation.

Further, by integrating a standard cell area in the cache memory, it may become possible to reduce the necessity of creating a new site outside the cache memory, thereby enabling to control the gaps between the cache memories. As a result, it may become possible to improve the packaging density of the entire chip of the semiconductor integrated circuit device.

Further, by adjusting the lengths (size) in the vertical and lateral directions of the cache memory to be equal to 2n of the bump pitch, the cache memories having the adjusted size may have an extra space. Then, by using the extra space, each area of the blocks of the basic circuits in the cache memory may be enlarged. As a result, the packaging design operation based on the study of DFM (Design for Manufacturing) may be performed, thereby enabling to extend the distances between the positions of transistors and the distances between the signal wirings to reduce the capacitance between the signal wirings. Therefore, it may become possible to provide a cache memory having more tolerance against noise and increase the yield rate of the semiconductor integrated circuit device.

Figure 5:
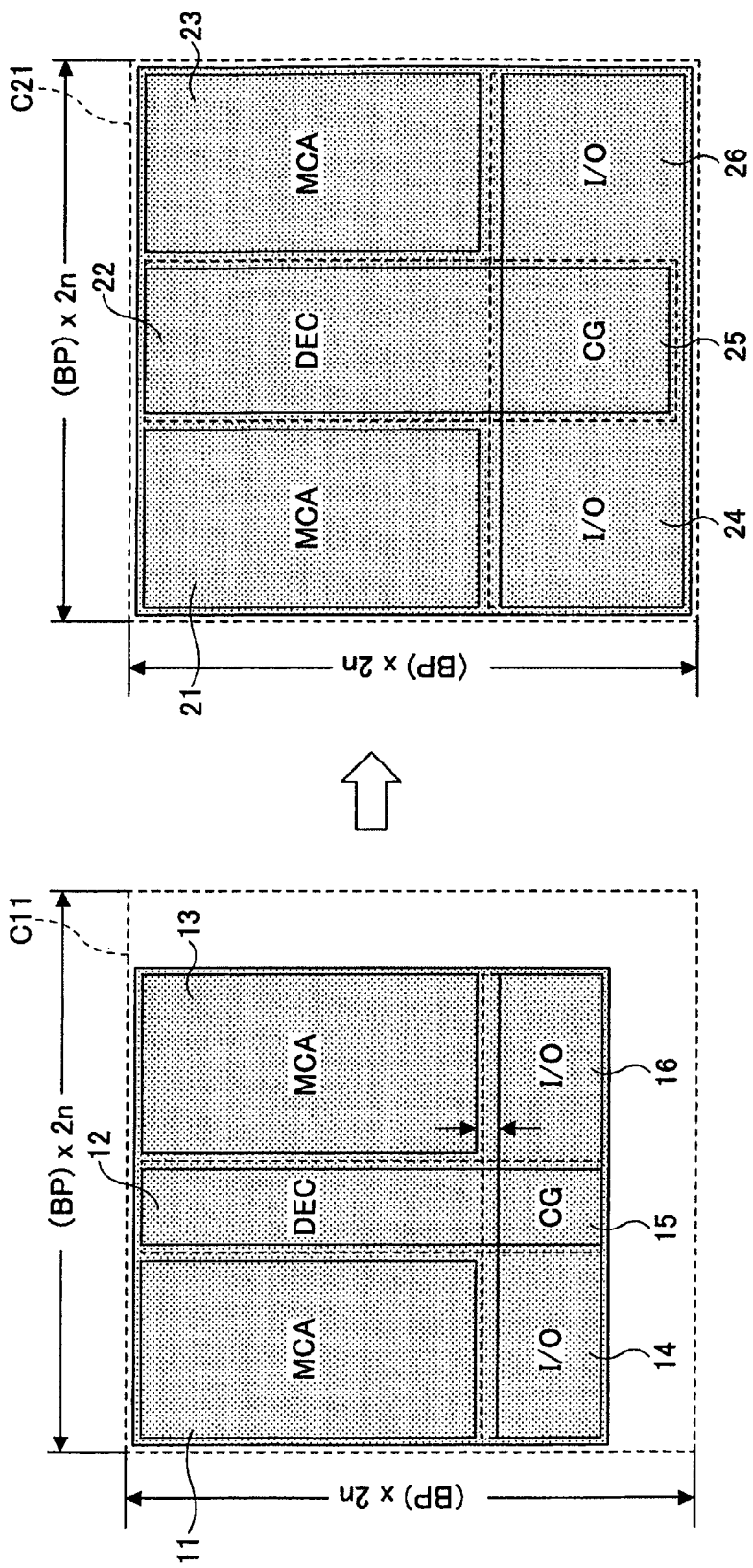
FIG. 5 illustrates a schematic comparison of a configuration of a conventional semiconductor integrated circuit device (FIG. 5A) and an exemplary configuration of a semiconductor integrated circuit device according to an embodiment of the present invention (FIG. 5B)

FIG. 5 schematically illustrates a comparison between a configuration of a conventional semiconductor integrated circuit device (FIG. 5A) and an exemplary configuration of a semiconductor integrated circuit device according to an embodiment of the present invention (FIG. 5B).

Namely, FIG. 5A illustrates a conventional cache memory C11 where no embodiments of the present invention are applied. As illustrated in FIG. 5A, the cache memory C11 includes blocks of basic circuits as main circuits including memory cell arrays 11 and 13, a clock generator 15, input/output circuits 14 and 16 serving as an interface to the outside of the cache memory C11, and a control circuit 12 having functions such as an address decoder.

Accordingly, FIG. 5A illustrates an exemplary circuit configuration of the cache memory C11, the circuit configuration being formed by performing packaging design operation in which an emphasis is mainly placed on packaging efficiency to minimize the packaging area).

In this case, as illustrated in FIG. 5A, the lengths (size) in the vertical and lateral directions of the cache memory may not be equal to 2n of the bump pitch. Because of this feature, it may become necessary to separately perform packaging design operation with respect to each of the cache memories, thereby degrading the efficiency of the packaging design operation.

On the other hand, FIG. 5B illustrates an exemplary circuit configuration of the cache memory C21 in a semiconductor integrated circuit device according to an embodiment of the present invention.

As illustrated in FIG. 5B, the packaging design operation of the cache memory C21 is performed in a manner such that the lengths (size) in the vertical and lateral directions of the cache memory are equal to 2n of the bump pitch. As a result, it may become possible to improve the efficiency of the packaging design operation.

As illustrated in FIG. 5B, the lengths (size) in the vertical and lateral directions of the cache memory are adjusted to be equal to 2n of the bump pitch by enlarging the areas of the blocks of the basic circuits in the cache memory C11 illustrated in FIG. 5A.

As illustrated in FIG. 5B, similar to the cache memory C11 of FIG. 5A, the cache memory C21 includes blocks of basic circuits as main circuits including memory cell arrays 21 and 23, a clock generator 25, input/output circuits 24 and 26 serving as an interface to the outside of the cache memory C21, and a control circuit 22 such as an address decoder. This configuration of the blocks of the basic circuits is similar to that of the cache memory C11 of FIG. 5A. However, the sizes of the areas of the blocks of the basic circuits of the cache memory C21 in FIG. 5B are larger than the respective areas of the blocks of the basic circuits of the cache memory C11 in FIG. 5A.

One of the methods of enlarging the areas of the blocks of the basic circuits is to extend the distances between the transistors and the distances between the signal wirings. In a general packaging design operation, the transistors, signal wirings and the like may be disposed in a manner such that the size of the cache memories can be minimized based on the minimum rule of MDR (Mask Design Rule). However, in this embodiment of the present invention, as described above, the packaging design operation is performed in a manner such that the lengths (size) in the vertical and lateral directions of the cache memory are adjusted to be equal to 2n of the bump pitch by enlarging the block areas of the basic circuits in the cache memories. By performing the packaging design operation in this way, the cache memories may have an extra space. Then, by using the extra space, it may become possible to extend the distances between the positions of transistors and the distances between the signal wirings.

As a result, it may become possible to reduce the capacitance between the signal wirings in the cache memories, thereby enabling to produce cache memories having more tolerance against noise. Namely, the packaging design operation based on the study of DFM (Design for Manufacturing) may be performed, thereby enabling to increase the yield rate of the semiconductor integrated circuit device.

Figure 6:
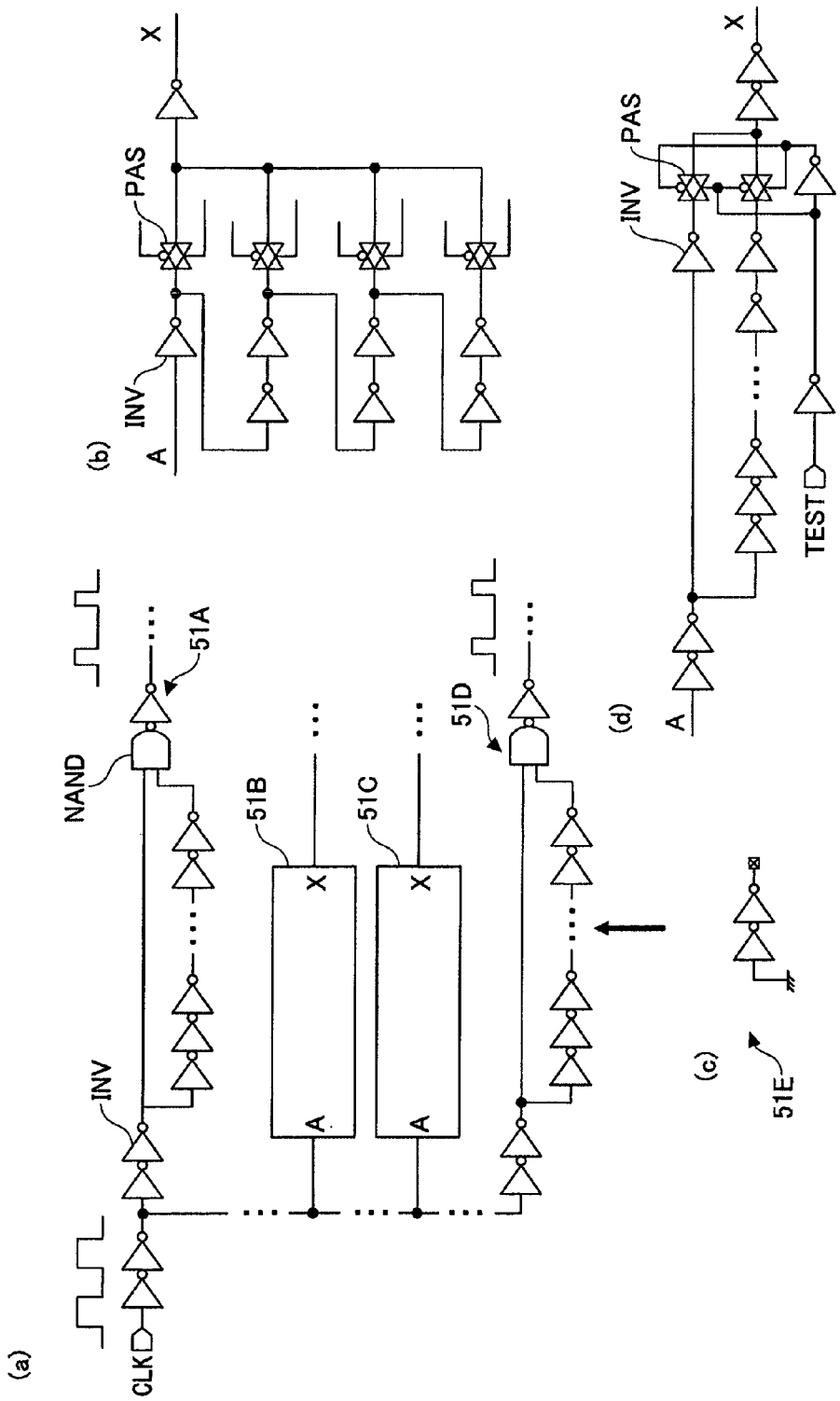
FIG. 6 illustrates exemplary circuit diagrams which may be included in a clock generator of a cache memory in a semiconductor integrated circuit device according to an embodiment of the present invention.

Another exemplary method of enlarging the areas of the blocks of the basic circuits may be to add a timing adjusting circuit 51B, a dummy transistor circuit 51E for chip update, a test circuit 51C as illustrated in FIGS. 6B through 6D or the like to the clock generator 15.

FIG. 6(a) illustrates a clock generator 25 including duty (or clock signal phase) adjustment circuits 51A and 51D. The duty adjustment circuits 51A and 51D receive a main clock signal CLK from outside of the cache memory and distribute the received clock signal CLK to the other blocks of the basic circuits in the cache memory. To that end, as illustrated in FIG. 6(a), the duty adjustment circuits 51A and 51D provide a function to adequately adjust the clock signal phase or duty by using the functions of inverter circuits INV connected in series and a NAND circuit NAND.

Recently, with miniaturization of the packaging structure of semiconductor integrated circuit devices, variation of manufacturing of the transistors may become a serious problem. Especially, in the cache memories of the semiconductor integrated circuit devices, there may be cases where it is difficult to adequately adjust the timing within the cache memory. Therefore, in the worst case, it may be supposed that the cache memory does not operate normally due to the variation of manufacturing of the transistors.

In contrast, by using the extra space obtained by enlarging the areas of the blocks of the basic circuits in the cache memory, the timing adjusting circuit 51B may be added to the clock generator 15 to adequately adjust the timing of the clock signal to the cache memory. By adding the timing adjusting circuit 51B in this way, it may become possible to perform fine timing adjustment in the cache memory, thereby enabling to produce a cache memory having higher tolerance against the variation of manufacturing.

FIG. 6(b) illustrates an exemplary circuit configuration of the timing adjusting circuit 51B.

As illustrated in FIG. 6(b), the timing adjusting circuit 51B is made of a combination of inverter circuits INV and pass transistors PAS. By the switching control of the pass transistors PAS, the number of series of inverters constituting the timing adjusting circuit 51B can be determined. By doing this, a delay amount of the signal to be output from the timing adjusting circuit 51B may be determined.

Otherwise, by using the extra space obtained by enlarging the areas of the blocks of the basic circuits in the cache memory, the dummy transistor circuit 51E may be added to the clock generator 15 to update the chip of the semiconductor integrated circuit device. By adding the dummy transistor circuit 51E in this way, when the chip of the semiconductor integrated circuit device is faulty due to a fault in a cache memory, it may become possible to update the chip of the semiconductor integrated circuit device by changing wiring patterns between transistors and the like (a.k.a. metal update) without changing the positions of the transistors and the like (a.k.a. bulk update); thereby enabling to remarkably reduce the cost to update the chip.

FIG. 6(c) illustrates an exemplary circuit configuration of the dummy transistor circuit 51E.

As illustrated in FIG. 6(c), the dummy transistor circuit 51E includes plural inverters connected in series with each other. By changing the wiring patterns between transistors and the like (performing the metal update), the dummy transistor circuit 51E may be added to the duty (or clock signal phase) adjustment circuit 51D. By adding the dummy transistor circuit 51E in this way, it may become possible to change the waveform of the clock signal generated by the duty (or clock signal phase) adjustment circuit 51D. As a result, by updating the chip in this way, it may become possible to update a faulty chip by removing the cause of the trouble.

Otherwise, by using the extra space obtained by enlarging the areas of the blocks of the basic circuits in the cache memory, the test circuit 51C may be added to the clock generator 15. By adding the test circuit 51C in this way, it may become possible to conduct a test of the cache memory by using the added test circuit 51C.

FIG. 6(d) illustrates an exemplary circuit configuration of the test circuit 51C.

As illustrated in FIG. 6(d), the test circuit 51C is made of a combination of the inverter circuits INV and the pass transistors PAS. By the switching control of the pass transistors PAS, the number of series of inverters constituting the test circuit 51C can be determined. By doing this, a delay amount of the signal to be output from the test circuit 51C may be determined. By using this feature, it may become possible to test the operations of the circuits in response to various delay amounts.

Further, in the case where the areas of the blocks of the basic circuits in the cache memories are enlarged so that the lengths (size) in the vertical and lateral directions of the cache memory are adjusted to be equal to 2n of the bump pitch, if the difference in the lengths (size) in the vertical and/or lateral directions of the cache memory between before the enlargement and after the enlargement exceeds a predetermined value (e.g., approximately 100 μm), the lengths of the wirings between the blocks of the basic circuits become longer; and as a result, a delay amount during the operations of the cache memory may be increased.

In such a case, instead of simply enlarging the areas of the blocks of the basic circuits in the cache memory so that the lengths (size) in the vertical and lateral directions of the cache memory are adjusted to be equal to 2n of the bump pitch, the following method may be employed.

As illustrated in FIGS. 7A and 7B, in addition to enlarging the areas of the blocks of the basic circuits in the cache memory in the method described above, a standard cell like a repeater which is not expressed (configured) using complicated logic circuits may be integrated (included) in the cache memory.

As illustrated in FIG. 7B, similar to the cache memory C11 of FIG. 7A, the cache memory C31 includes blocks of basic circuits as main circuits including memory cell arrays 31 and 33, a clock generator 35, input/output circuits 34 and 36, and a control circuit 32 having functions such as an address decoder. This configuration of the blocks of the basic circuits are similar to that of the cache memory C11 of FIG. 7A. However, as illustrated in FIG. 7B, the sizes of the areas of the blocks of the basic circuits of the cache memory C31 in FIG. 7B are larger than those of the cache memory C11 in FIG. 7A by a predetermined amount.

In addition to that, in the case of FIG. 7B, a standard cell area 37 is provided in which a standard cell is added in the cache memory C31. As a result, as illustrated in FIG. 7B, due to the added standard cell area 37, the area of the cache memory C31 may further be enlarged, so that the lengths (size) in the vertical and lateral directions of the cache memory are adjusted to be equal to 2n of the bump pitch.

By employing the method illustrated in FIG. 7B, it may become possible to adjust the lengths (size) in the vertical and lateral directions of the cache memory to be equal to 2n of the bump pitch without inadequately extending the lengths of the wirings between the blocks of the basic circuits in the cache memory.

Figure 8:
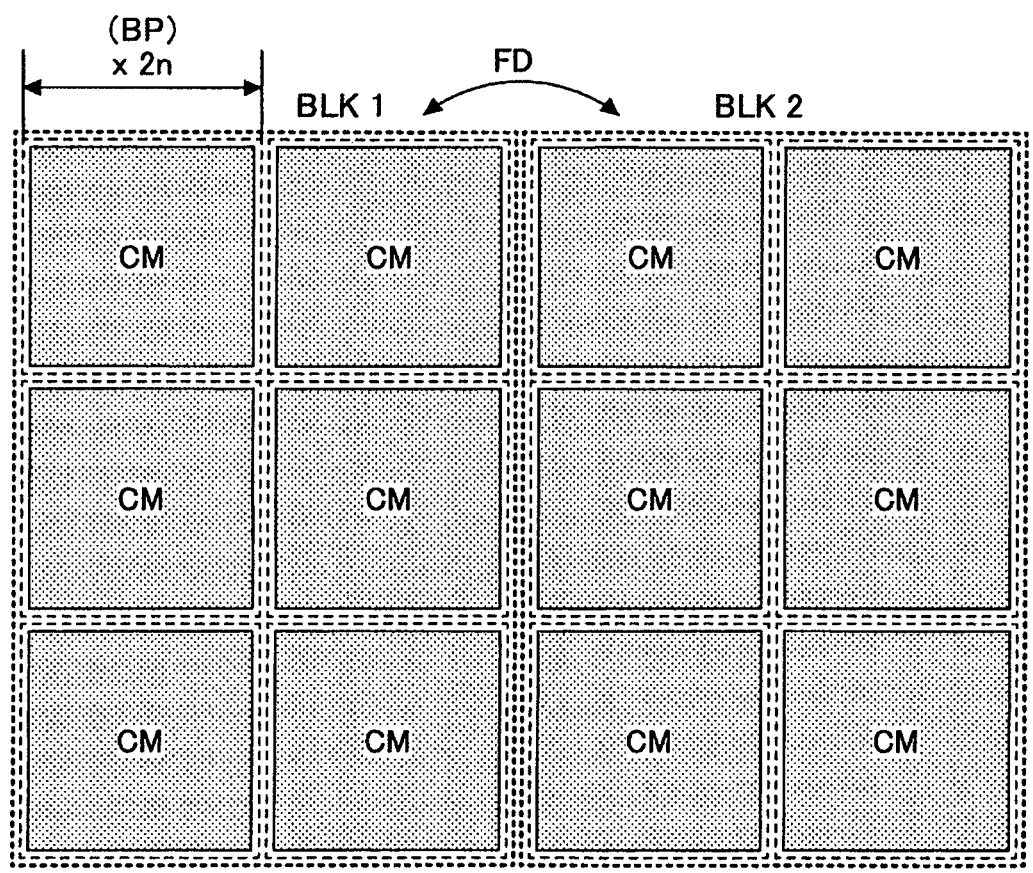
FIG. 8 is a top view illustrating an exemplary configuration of a semiconductor integrated circuit device according to an embodiment of the present invention.

Further, by employing the method illustrated in FIG. 7B to integrate the repeater-like standard cell area in the cache memory, it may become possible to maximally remove the necessity to separately provide a site such as the standard cell area outside the cache memory after the flip development is performed on the blocks of the basic circuits in the high-level design operation. As a result, as illustrated in FIG. 8, it may become possible to arrange the cache memories closer together, thereby enabling to improve the packaging density of the entire chip of the semiconductor integrated circuit device.

As described above, by adjusting the lengths (size) in the vertical and lateral directions of the cache memory to be equal to 2n of the bump pitch by enlarging the areas of the blocks of the basic circuits in the cache memory or by integrating the standard cell in the cache memory, it may become possible to remove the necessity of separately considering the difference in relative positions of the wiring patterns P151 and P152 connecting between the terminals inside the cache memories and the outside of the cache memories with respect to the power source patterns P111, P121, P112, and P122 on the upper layer with respect to each cache memory. As a result, it may become possible to repeatedly use packaging design data of one cache memory to be applied to the other cache memories; which may remarkably improve the efficiency of the packaging design operation.

In the case of FIG. 9, the lengths (size) in the vertical and lateral directions of the cache memories C41 and C42 are adjusted to be equal to 2n of the bump pitch, the bumps on the upper layer being disposed in the same manner for all the cache memories. Further, in FIG. 9, same as the case in FIG. 4, the half-toned bumps B represent the VSS bumps and the bumps B without half-toned pattern represent the VDD bumps.

In the case where the lengths in the vertical and lateral directions of the cache memory are equal to an odd multiple of (in this case, as an example, three times) the bump pitch, the number of bumps belonging to each cache memory is nine (3×3=9). In this case, in some cache memories, there are five VDD bumps and four VSS bumps, and in other cache memories adjacent to the above cache memories, there are four VDD bumps and five VSS bumps. Therefore, the arrangement of the bumps in the cache memories may vary and may not be constant in the same semiconductor integrated circuit device.

On the other hand, according to an embodiment of the present invention, as described above, the lengths in the vertical and lateral directions of the cache memory are equal to an even multiple of the bump pitch. For example, by performing the packaging design operation in a manner such that the lengths in the vertical and lateral directions of the cache memory are equal to four times the bump pitch, the number of the bumps belonging to each of the cache memories is sixteen (4×4=16)), and the number of the VDD bumps is eight (8) and the number of the VSS bumps is also eight (8). Further, the arrangement of those bumps becomes constant in all the cache memories. Therefore, for example, in the case of FIG. 9, the relative positions of the bumps with respect to the cache memory C41 and the relative positions of the bumps with respect to the cache memory C42 may become the same. As a result, the arrangement of the power source patterns, that are disposed lower than the bumps and higher than the layer where the logic circuits constituting the cache memories are formed and that are connected to the bumps B, may become constant between cache memories C41 and C42 as illustrated in FIG. 9.

As a result, the relative positions of the pins A, B, C, and D with respect to the power source patterns P111, P121, P112, P122 and the like formed on an upper layer may become constant between cache memories C41 and C42. Therefore, in the packaging design operation of the cache memories C41 and C42, packaging design data of one cache memory may be applied to the other cache memory without performing the packaging design operation with respect to both of the cache memories.

Therefore, it may become possible to repeatedly use packaging design data of one cache memory to be applied to the other cache memories, thereby enabling to improve the efficiency of the packaging design operation.

According to an embodiment of the present invention, it may become possible to effectively reduce the total development man-hours of the semiconductor integrated circuit devices and costs; and it may become possible to design and manufacture products having higher performances at a higher yield rate in a shorter time period.

In FIGS. 1, 2, 4, 5, 7, 8, 9, for the explanatory purposes, the gaps between the cache memories may be explicitly expressed. However, the actual gaps between adjacent cache memories, between the cache memory and the adjacent standard cell area and the like are negligibly small compared with the lengths (size) in the vertical and lateral directions of the cache memories. Because of this feature, the above description "the lengths in the vertical and lateral directions of the cache memory are adjusted to be equal to an even multiple of the bump pitch" may be regarded as equivalent to the description "when a substrate of a semiconductor integrated circuit device is divided and the areas of the cache memories are allocated, the lengths in the vertical and lateral directions of the areas to be allocated to the cache memories are adjusted to be equal to an even multiple of the bump pitch". Then, in such a configuration, the relative positions of the bumps on an upper layer with respect to each of the cache memories may become constant.

According to an embodiment of the present invention, it may become possible to provide a semiconductor integrated circuit capable of improving the efficiency of packaging design operation without degrading the packaging efficiency.

According to an embodiment of the present invention, the relative positions of the bumps on the upper layer with respect to each of the cache memories may become constant while a problem of reducing the packaging efficiency of the semiconductor integrated circuit device is resolved. Therefore, it may become possible to repeatedly use packaging design data of one cache memory to be applied to the other cache memories, thereby enabling to improve the efficiency of the packaging design operation.

In the above embodiments, as an example, a case is described where the lengths in the vertical and lateral directions of the cache memory are adjusted to be equal to an even multiple (e.g., four times) of the bump pitch. However, the present invention is not limited to this configuration. For example, the present invention may include a configuration in which at least one of the length in the vertical direction and the length in the lateral direction of the cache memory is adjusted to be equal to an even multiple of the bump pitch.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the sprit and scope of the invention.

What is claimed is:

1. A semiconductor device comprising:
plural bumps arranged at regular intervals; and
a cache memory, wherein
lengths in a vertical direction and a lateral direction of the cache memory are equal to an even multiple of a distance between the bumps adjacent to each other.

2. A method of designing and making a semiconductor device having plural bumps arranged at regular intervals and a cache memory, the method comprising:
designing and making the semiconductor device in a manner such that lengths in a vertical direction and a lateral direction of the cache memory are equal to an even multiple of a distance between the bumps adjacent to each other.

* * * * *